(12) United States Patent
Hotta

(10) Patent No.: US 8,754,418 B2
(45) Date of Patent: Jun. 17, 2014

(54) SEMICONDUCTOR DEVICE, AND METHOD FOR PRODUCING SAME

(75) Inventor: Kazushige Hotta, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 85 days.

(21) Appl. No.: 13/698,356

(22) PCT Filed: Feb. 2, 2011

(86) PCT No.: PCT/JP2011/052091
§ 371 (c)(1),
(2), (4) Date: Nov. 16, 2012

(87) PCT Pub. No.: WO2011/145362
PCT Pub. Date: Nov. 24, 2011

(65) Prior Publication Data
US 2013/0056766 A1    Mar. 7, 2013

(30) Foreign Application Priority Data

May 18, 2010  (JP) .................................. 2010-114796

(51) Int. Cl.
| H01L 27/14 | (2006.01) |
| H01L 29/04 | (2006.01) |
| H01L 29/15 | (2006.01) |
| H01L 31/036 | (2006.01) |

(52) U.S. Cl.
USPC ................... 257/72; 257/57; 257/59; 257/60; 257/61; 257/64; 257/70; 257/71; 257/75

(58) Field of Classification Search
CPC ................ H01L 27/1214; H01L 27/12; H01L 29/66757; H01L 29/78621; G02F 1/13454
USPC .......................................................... 257/72
See application file for complete search history.

(56) References Cited

U.S. PATENT DOCUMENTS

| 6,777,254 B1 | 8/2004 | Yamazaki et al. |
| 7,202,499 B2 * | 4/2007 | Nakajima ........................ 257/59 |
| 2006/0081846 A1 * | 4/2006 | Yamazaki et al. ............... 257/59 |

FOREIGN PATENT DOCUMENTS

| JP | H06-088972 A | 3/1994 |
| JP | 2001-077373 A | 3/2001 |
| JP | 2004-170999 A | 6/2004 |
| JP | 2004-341540 A | 12/2004 |

* cited by examiner

*Primary Examiner* — Robert Huber
*Assistant Examiner* — Long Le
(74) *Attorney, Agent, or Firm* — Chen Yoshimura LLP

(57) ABSTRACT

Disclosed is a semiconductor device 100A that has first lightly doped drain regions 31A1 and 32A1 between a source region 34A1 and a channel region 33A1 of a first conductive-type driver circuit TFT 10A1 and/or between a drain region 35A1 and the channel region 33A1 of the first conductive-type driver circuit TFT 10A1, and second lightly doped drain regions 31C and 32C between a source region 34C and a channel region 33C of a first conductive-type pixel TFT 10C and/or between a drain region 35C and the channel region 33C of the first conductive-type pixel TFT 10C, in which the first lightly doped drain regions 31A1 and 32A1 have first conductive-type impurities n1 at a first impurity concentration $C_1$, and the second lightly doped drain regions 31C and 32C have first conductive-type impurities n1 at the first impurity concentration $C_1$ and second conductive-type impurities p2 at a second impurity concentration $C_2$.

13 Claims, 8 Drawing Sheets

(a)

(b)

(a)

(b)

(c)

(d)

(e)

SEMICONDUCTOR DEVICE, AND METHOD FOR PRODUCING SAME

TECHNICAL FIELD

The present invention relates to a semiconductor device provided with a thin film transistor (TFT) and to a method for producing same.

BACKGROUND ART

A TFT that uses polycrystalline silicon (p-Si) can be used as a switching element of an active matrix display device (Patent Documents 1 to 3, for example). A TFT having polycrystalline silicon has a greater mobility than a TFT having amorphous silicon (a-Si), and therefore, it is possible to form not only pixel TFTs for conducting display, but also driver circuit TFTs, which require fast operations. For the pixel TFT, a TFT with a small off-current is needed in order to maintain a high display quality, and for the driver circuit TFT, a TFT with a large on-current is needed because of the need for fast operations.

A structure of a TFT in which a lightly doped drain region (sometimes referred to as LDD region below) is formed on at least one of the space between a channel region and a source region, and the space between the channel region and a drain region is widely used (Patent Documents 1 to 3, for example). Such a configuration is referred to as an "LDD structure." By forming the LDD region, the electrical field concentration in the vicinity of the source region or the drain region can be lowered, thus allowing the off-current to be small and improving the long term reliability.

Patent Document 1 discloses a semiconductor device that has an LDD region in both the driver circuit TFT and the pixel TFT, in which the impurity concentration in the LDD region of the n-type pixel TFT is lower than the impurity concentration in the LDD region of the n-type driver circuit TFT, for example. With this configuration, the off-current of the pixel TFT can be made small without reducing the on-current of the driver TFT. As a result, a liquid crystal display device in which no display unevenness occurs, and in which the operation speed of the driver circuit is fast can be attained.

Patent Document 2 discloses a semiconductor device that has an LDD region in both the driver circuit TFT and the pixel TFT, in which the LDD region of the n-type pixel TFT is longer than the LDD region of the n-type driver circuit TFT. With this configuration, the off-current of the pixel TFT can be made small without reducing the on-current of the driver circuit TFT. As a result, a liquid crystal display device in which no display unevenness occurs, and in which the operation speed of the driver circuit is fast can be attained.

RELATED ART DOCUMENTS

Patent Documents

Patent Document 1: Japanese Patent Application Laid-Open Publication No. 2004-341540
Patent Document 2: Japanese Patent Application Laid-Open Publication No. 2004-170999
Patent Document 3: Japanese Patent Application Laid-Open Publication No. H6-88972

SUMMARY OF THE INVENTION

Problems to be Solved by the Invention

The semiconductor devices disclosed in Patent Documents 1 to 3 have LDD regions in both the driver circuit TFT and the pixel TFT, and thus, the p-type driver circuit TFT also has an LDD region. If the p-type driver circuit TFT has an LDD region, then there is a problem that the on-current is reduced, and the size of the TFT is increased by an amount equal to the size of the LDD region. Also, a method for producing TFTs having an LDD structure is complex. The manufacturing method is especially complex when providing different impurity concentrations between the LDD region of the pixel TFT and the LDD region of the driver circuit TFT.

The present invention is made in view of the above-mentioned problem, and an object thereof is to provide a semiconductor device with excellent TFT properties and a simple method for producing this semiconductor device.

Means for Solving the Problems

A semiconductor device of the present invention includes: a pixel thin film transistor of a first conductive type; a driver circuit thin film transistor of the first conductive type; a driver circuit thin film transistor of a second conductive type that differs from the first conductive type; a first lightly doped drain region between at least either of a channel region and a source region of the driver circuit thin film transistor of the first conductive type, and the channel region and a drain region of the driver circuit thin film transistor of the first conductive type; and a second lightly doped drain region between at least either of a channel region and a source region of the pixel thin film transistor, and the channel region and a drain region of the pixel thin film transistor, wherein the first lightly doped drain region has impurities of the first conductive type at a first impurity concentration, wherein the channel region of the pixel thin film transistor and the channel region of the driver circuit thin film transistor of the first conductive type have impurities of the second conductive type at a second impurity concentration, which is lower than the first impurity concentration, and wherein the second lightly doped drain region has the impurities of the first conductive type at the first impurity concentration and the impurities of the second conductive type at the second impurity concentration.

In an embodiment, the first lightly doped drain region is formed both between the channel region and the source region of the driver circuit thin film transistor of the first conductive type, and between the channel region and the drain region of the driver circuit thin film transistor of the first conductive type.

In an embodiment, the second lightly doped drain region is formed both between the channel region and the source region of the pixel thin film transistor, and between the channel region and the drain region of the pixel thin film transistor.

In an embodiment, the pixel thin film transistor of the first conductive type further includes a third lightly doped drain region formed between the first lightly doped drain region and the channel region of the driver circuit thin film transistor of the first conductive type, wherein the third lightly doped drain region has the impurities of the first conductive type at the first impurity concentration, and the impurities of the second conductive type at the second impurity concentration.

In an embodiment, the pixel thin film transistor of the first conductive type further includes a fourth region formed between the first lightly doped drain region and the channel region of the driver circuit thin film transistor of the first conductive type, wherein the fourth region has the impurities of the second conductive type at a third impurity concentration, which is lower than the second impurity concentration.

In an embodiment, the first conductive type is an n type, and the second conductive type is a p type.

A display device of the present invention has any one of the above-mentioned semiconductor devices.

A method for producing a semiconductor device according to the present invention is a method for producing a semiconductor device having a pixel thin film transistor of a first conductive type, a driver circuit thin film transistor of the first conductive type, and a driver circuit thin film transistor of a second conductive type that differs from the first conductive type, including: (a) doping impurities of the first conductive type at a first impurity concentration; (b) doping impurities of the second conductive type at a second impurity concentration, which is lower than the first impurity concentration; (c) forming a first lightly doped drain region containing the impurities of the first conductive type at the first impurity concentration between at least either of a channel region and a source region of the driver circuit thin film transistor of the first conductive type, and the channel region and a drain region of the driver circuit thin film transistor of the first conductive type; and (d) forming a second lightly doped drain region between at least either of a channel region and a source region of the pixel thin film transistor, and the channel region and a drain region of the pixel thin film transistor, the second lightly doped drain region containing the impurities of the first conductive type at the first impurity concentration and the impurities of the second conductive type at the second impurity concentration.

In an embodiment, the step (c) includes a step (c1) of forming the first lightly doped drain region between both the channel region and the source region of the driver circuit thin film transistor of the first conductive type, and the channel region and the drain region of the driver circuit thin film transistor of the first conductive type.

In an embodiment, the step (d) includes a step (d1) of forming the second lightly doped drain region between both the channel region and the source region of the pixel thin film transistor, and the channel region and the drain region of the pixel thin film transistor.

In an embodiment, the step (a) includes a step (a1) of forming a third lightly doped drain region, which has the impurities of the first conductive type at the first impurity concentration and the impurities of the second conductive type at the second impurity concentration, between the first lightly doped drain region and the channel region of the driver circuit thin film transistor of the first conductive type.

In an embodiment, the step (a) includes a step (a2) of forming a fourth region, which has the impurities of the second conductive type at a third impurity concentration that is lower than the second impurity concentration, between the first lightly doped drain region and the channel region of the driver circuit thin film transistor of the first conductive type.

In an embodiment, the step (a) includes a step (a3) of doping impurities of the n type at the first impurity concentration, and the step (b) includes a step (b1) of doping impurities of the p type at the second impurity concentration.

Effects of the Invention

According to the present invention, a semiconductor device having excellent TFT properties, and a simple method for producing this semiconductor device are provided.

DETAILED DESCRIPTION OF EMBODIMENTS

Embodiments of the present invention will be described below with reference to drawings. Semiconductor devices of embodiments according to the present invention and methods for producing the semiconductor devices will be described with a TFT substrate used in a liquid crystal display device as an example of a semiconductor device. The present invention is not limited thereto and it is also possible to apply the present invention to a TFT substrate used in an organic EL display device, for example.

Figure 1:
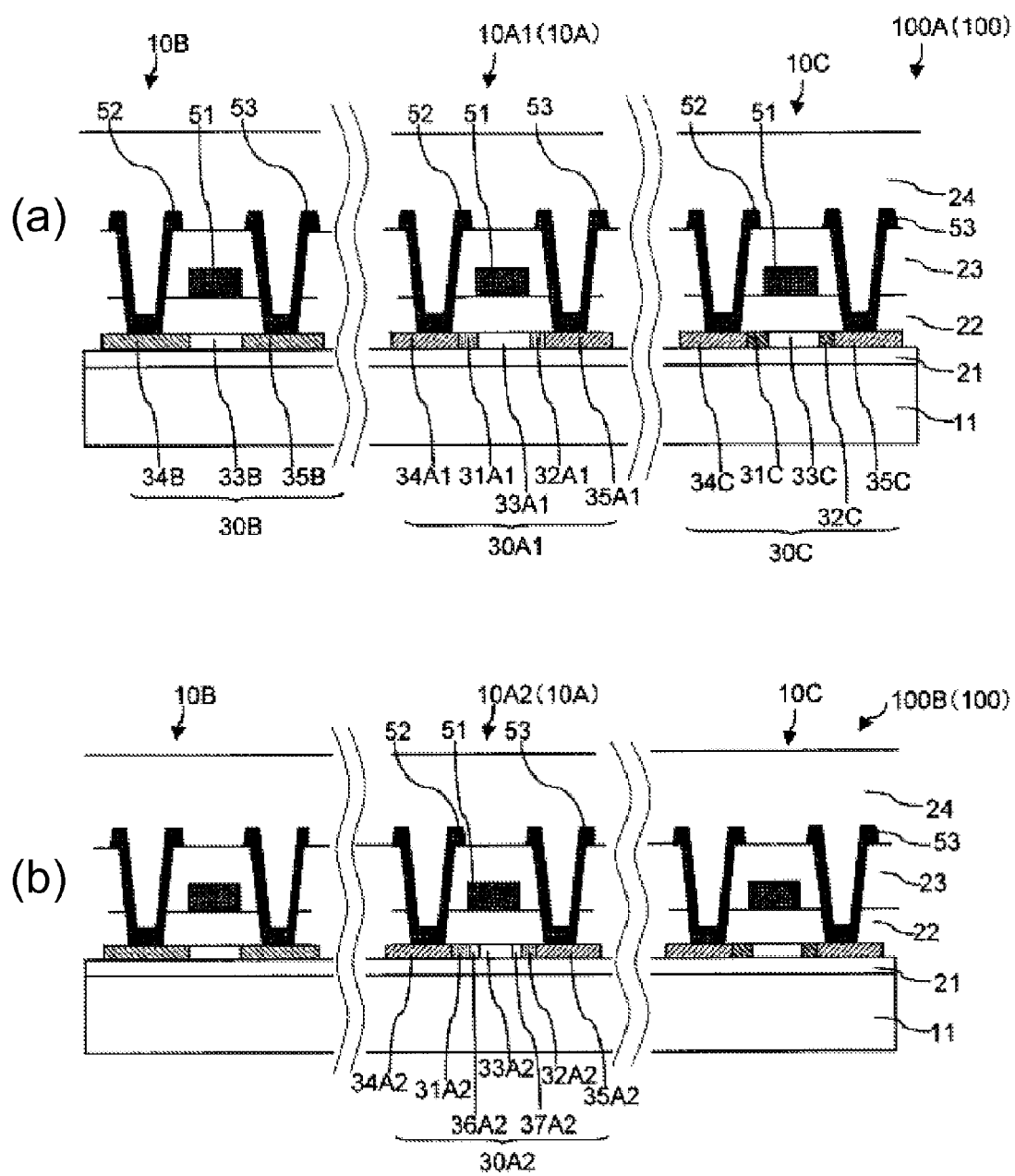
FIG. 1(a) is a schematic cross-sectional view of a TFT substrate 100A according to an embodiment of the present invention.
FIG. 1(b) is a schematic cross-sectional view of a TFT substrate 100B in another embodiment.
Figure 2:
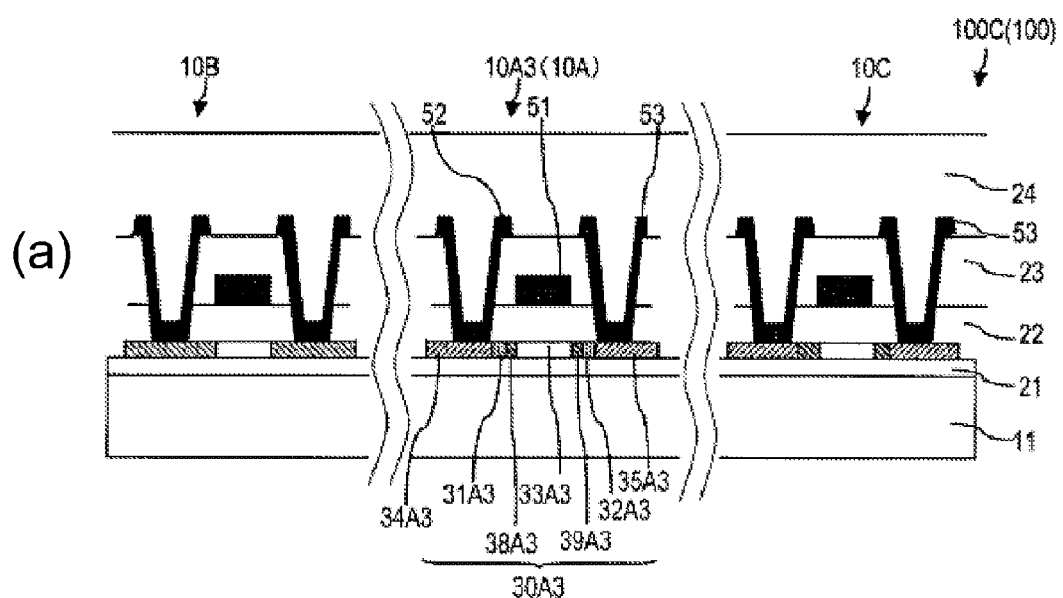
FIG. 2(a) is a schematic cross-sectional view of a TFT substrate 100C in another embodiment.
FIG. 2(b) is a schematic cross-sectional view of a TFT substrate 100D in another embodiment.
Figure 2:
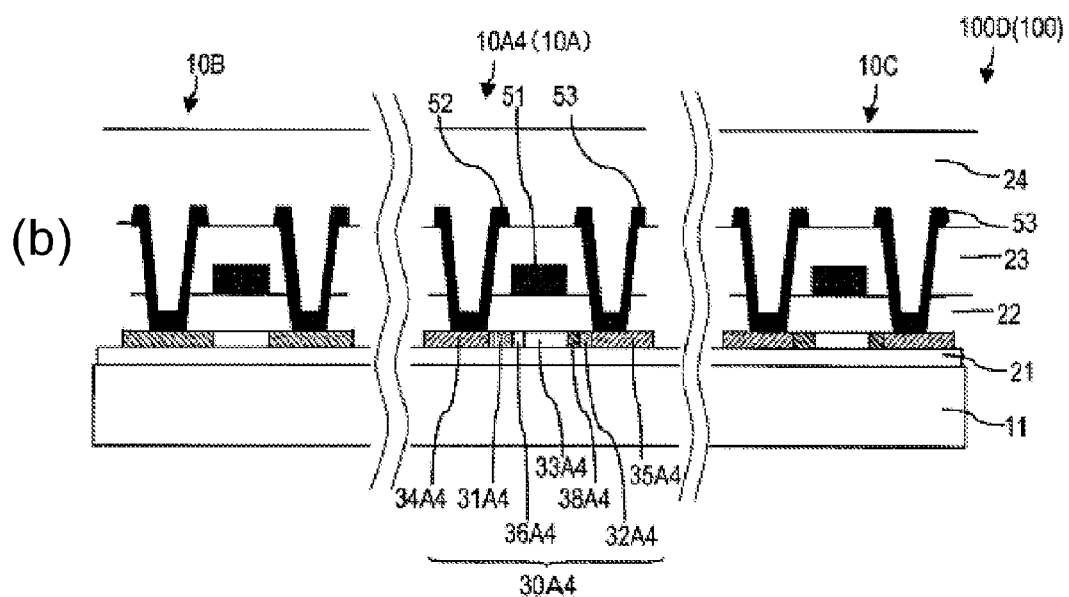
Figure 3:
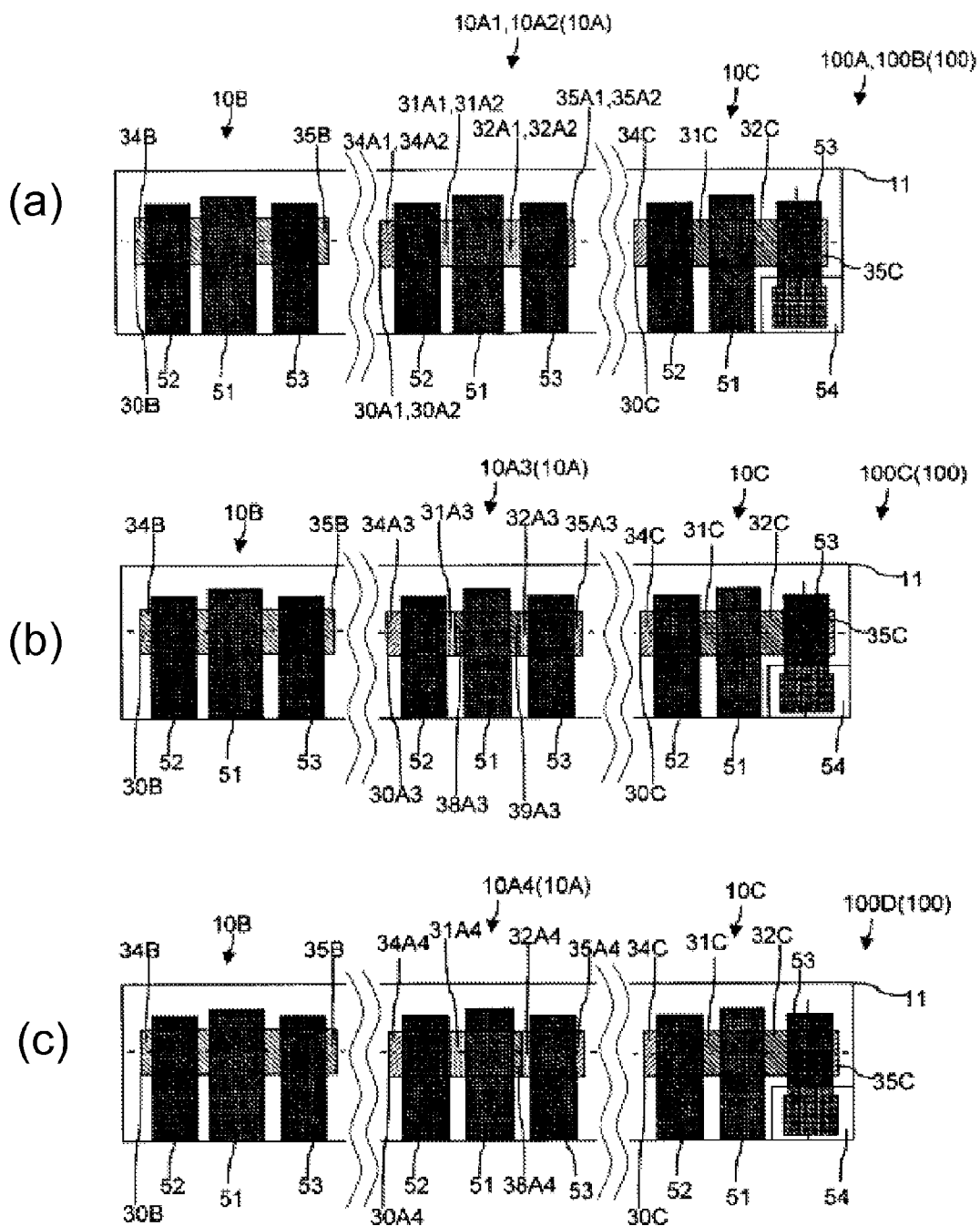
FIG. 3(a) is a schematic top view of the TFT substrates 100A and 100B.
FIG. 3(b) is a schematic top view of the TFT substrate 100C.
FIG. 3(c) is a schematic top view of the TFT substrate 100D.
Figure 4:
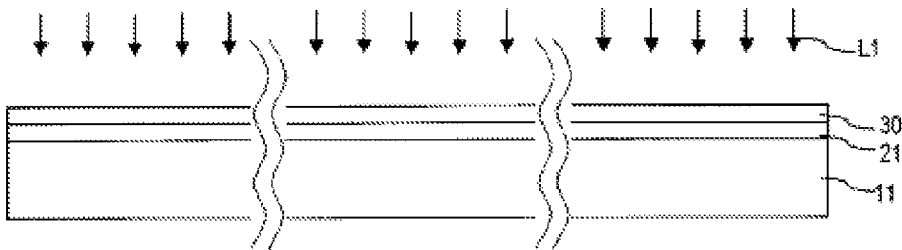
FIGS. 4(a) to 4(e) are cross-sectional views that show manufacturing steps for the TFT substrate 100A.
Figure 4:
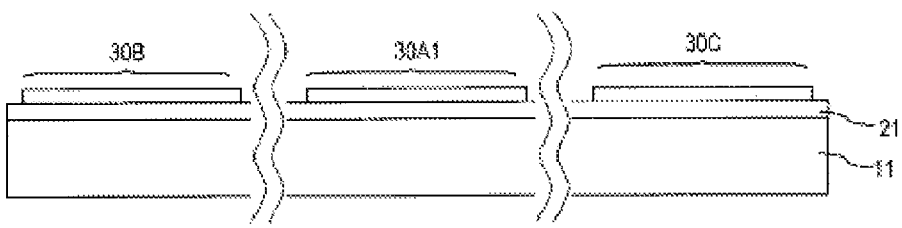
Figure 4:
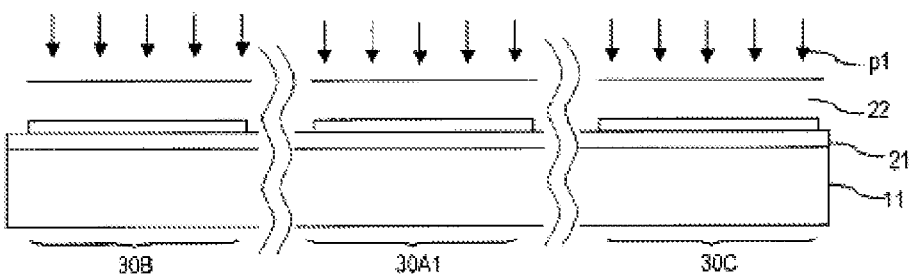
Figure 4:
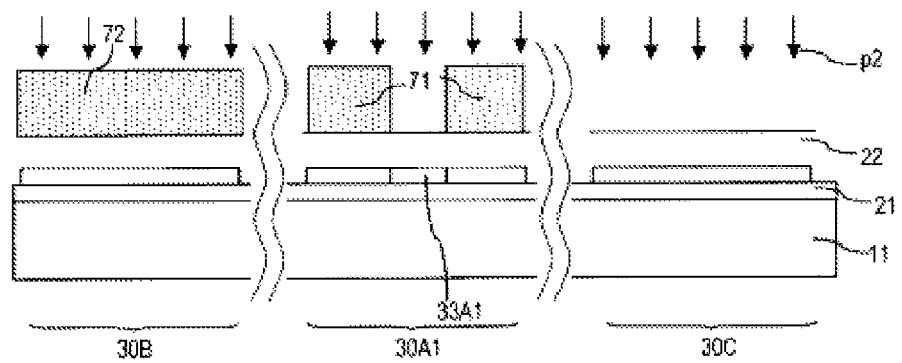
Figure 4:
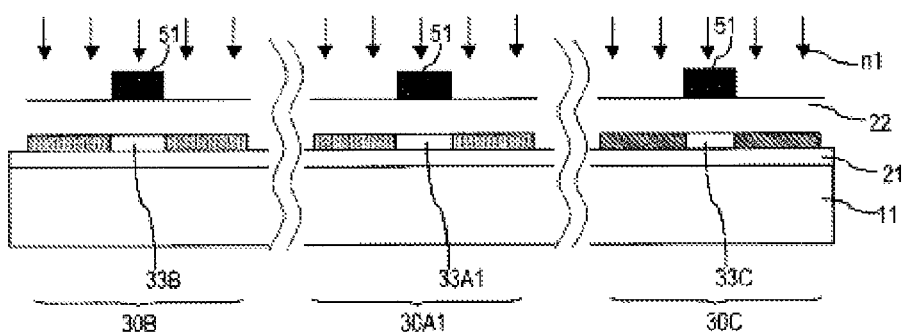
Figure 5:
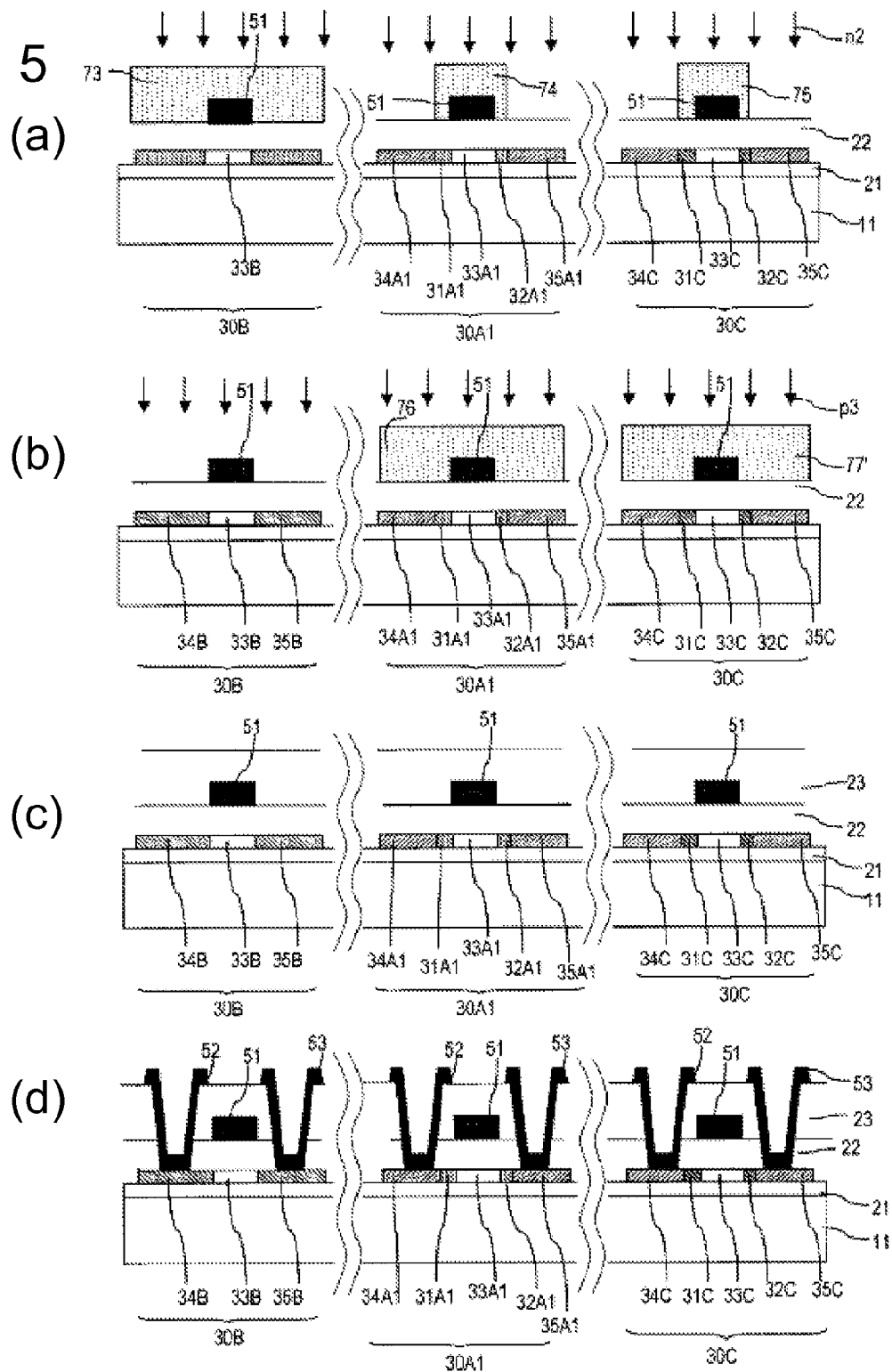
FIGS. 5(a) to 5(d) are cross-sectional views that show manufacturing steps for the TFT substrate 100A.

FIGS. 1 and 2 are schematic cross-sectional views that show the configuration of n-type driver circuit TFTs 10A1 to 10A4 (sometimes referred to as TFTs 10A), a p-type driver circuit TFT 10B, and an n-type pixel TFT 10C, which are on the TFT substrates 100A to 100D (sometimes referred to as TFT substrates 100) of embodiments according to the present invention. FIG. 3 is a schematic top view that shows a configuration of the TFT substrates 100A to 100D. Components in common between the TFT substrates 100 are assigned the same reference characters, and redundant descriptions will be omitted.

An example of a TFT substrate of a liquid crystal display device in an embodiment according to the present invention is the TFT substrate 100A. It is preferable that the TFT 100A be manufactured as designed, but there is a possibility that when attempting to manufacture the TFT 100A, misalignment or the like occurs in the manufacturing process, thus resulting in a TFT substrate 100B, 100C, or 100D being manufactured. First, the configuration of the TFT 100A will be described.

The TFT substrate 100A shown in FIGS. 1(a) and 3(a) has a first insulating layer 21 formed on an insulating substrate (a glass substrate, for example) 11, and an n-type driver circuit TFT 10A1, a p-type driver circuit TFT 10B, and an n-type pixel TFT 10C formed on the first insulating layer 21.

The n-type driver circuit TFT 10A1 is provided with a crystalline semiconductor layer (a polycrystalline silicon layer, for example) 30A1 that includes a channel region 33A1, a source region 34A1, and a drain region 35A1. The n-type driver circuit TFT 10A1 is also provided with a gate electrode 51, which controls the conductivity of the channel region 33A1, and a second insulating layer 22 formed below the gate electrode 51. The crystalline semiconductor layer 30A1 has first lightly doped drain regions (LDD regions) 31A1 and 32A1 formed between the channel region 33A1 and the source region 34A1, and the channel region 33A1 and the drain region 35A1, respectively. It is possible to form only one of the first lightly doped drain regions 31A1 and 32A1. The first lightly doped drain regions 31A1 and 32A1 have first conductive-type (n-type, for example) impurities (phosphorus (P), for example) at a first impurity concentration $C_1$ (between $5\times10^{17}$ cm$^{-3}$ and $3\times10^{18}$ cm$^{-3}$ inclusive, for example, and $1\times10^{18}$ cm$^{-3}$ in the present embodiment), and second conductive-type (p-type, for example) impurities (boron (B), for example) at a concentration lower than the first impurity concentration $C_1$ (between $3\times10^{16}$ cm$^{-3}$ and $3\times10^{17}$ cm$^{-3}$ inclusive, for example, and $6\times10^{16}$ cm$^{-3}$ in the present embodiment). The channel region 33A1 has the second conductive-type impurities, for example, at a second impurity concentration $C_2$ (between $3\times10^{16}$ cm$^{-3}$ and $3\times10^{17}$ cm$^{-3}$ inclusive, for example, and $2\times10^{17}$ cm$^{-3}$ in the present embodiment), which is lower than the first impurity concentration $C_1$. The source region 34A1 and the drain region 35A1 have the first conductive-type impurities at a concentration higher than the first impurity concentration $C_1$ (between $6\times10^{18}$ cm$^{-3}$ and $6\times10^{20}$ cm$^{-3}$ inclusive, for example, and $1\times10^{20}$ cm$^{-3}$ in the present embodiment). The n-type driver circuit TFT 10A1 has a third insulating layer 23 formed above the crystalline semiconductor layer 30A1 and additionally has a fourth insulating layer 24 formed on the third insulating layer 23. The n-type driver circuit TFT 10A1 has a source electrode 52 connected to the source region 34A1, and a drain electrode 53 connected to the drain region 35A1.

The p-type driver circuit TFT 10B is provided with a crystalline semiconductor layer 30B including a channel region 33B, a source region 34B, and a drain region 35B. The p-type driver circuit TFT 10B is also provided with the gate electrode 51, which controls the conductivity of the channel region 33B, and the second insulating layer 22 formed below the gate electrode 51. The source region 34B and the drain region 35B have the second conductive-type (p-type, for example) impurities (boron (B), for example) at a higher concentration than the second impurity concentration $C_2$ (between $5\times10^{18}$ cm$^{-3}$ and $2\times10^{20}$ cm$^{-3}$ inclusive, for example, and $2\times10^{19}$ cm$^{-3}$ in the present embodiment). The channel region 33B has second conductive-type impurities at the second impurity concentration $C_2$ (between $3\times10^{16}$ cm$^{-3}$ and $3\times10^{17}$ cm$^{-3}$ inclusive, for example, and $6\times10^{16}$ cm$^{-3}$ in the present embodiment). The p-type driver circuit TFT 10B has the third insulating layer 23 formed above the crystalline semiconductor layer 30B, and the fourth insulating layer 24 formed on the third insulating layer 23. The p-type driver circuit TFT 10B has the source electrode 52 connected to the source region 34B, and the drain electrode 53 connected to the drain region 35B. The p-type driver circuit TFT 10B does not have a lightly doped drain region (LDD region).

The n-type pixel TFT 10C is provided with a crystalline semiconductor layer 30C including a channel region 33C, a source region 34C, and a drain region 35C. The n-type pixel TFT 10C is also provided with the gate electrode 51, which controls the conductivity of the channel region 33C, and the second insulating layer 22 formed below the gate electrode 51. A crystalline semiconductor layer 30C has second lightly doped drain regions (LDD regions) 31C and 32C formed between the channel region 33C and the source region 34C, and between the channel region 33C and the drain region 35C. It is possible to form only one of the second lightly doped drain regions 31C and 32C. The second lightly doped drain regions 31C and 32C have first conductive-type (n-type, for example) impurities (phosphorus (P), for example) at the first impurity concentration $C_1$ (between $5\times10^{17}$ cm$^{-3}$ and $3\times10^{18}$ cm$^{-3}$ inclusive, for example, and $1\times10^{18}$ cm$^{-3}$ in the present embodiment), and second conductive-type (p-type for example) impurities (boron (B), for example) at the second impurity concentration $C_2$ (between $3\times10^{16}$ cm$^{-3}$ and $3\times10^{17}$ cm$^{-3}$ inclusive, for example, and $2\times10^{17}$ cm$^{-3}$ in the present embodiment), which is lower than the first impurity concentration $C_1$. The channel region 33C has the second conductive-type impurities at the second impurity concentration $C_2$ (between $3\times10^{16}$ cm$^{-3}$ and $3\times10^{17}$ cm$^{-3}$ inclusive, for example, and $2\times10^{17}$ cm$^{-3}$ in the present embodiment), for example. The source region 34C and the drain region 35C have the first conductive-type impurities at a concentration higher than the first impurity concentration $C_1$ (between $6\times10^{18}$ cm$^{-3}$ and $6\times10^{20}$ cm$^{-3}$ inclusive, for example, and $1\times10^{20}$ cm$^{-3}$ in the present embodiment). The n-type pixel TFT 10C has the third insulating layer 23 formed above the crystalline semiconductor layer 30C, and also has the fourth insulating layer 24 formed on the third insulating layer 23. The n-type pixel TFT 10C has the source electrode 52 connected to the source region 34C, and the drain electrode 53 connected to the drain region 35C. As shown in FIG. 3(a), the n-type pixel TFT 10C is connected to the pixel electrode 54 via the drain electrode 53.

The n-type impurity concentration of the LDD regions (second lightly doped drain regions 31C and 32C) of the n-type pixel TFT 10C is equal to the n-type impurity concentration of the LDD regions (first lightly doped drain regions 31A1 and 32A1) of the n-type driver circuit TFT 10A1. However, the LDD regions of the n-type pixel TFT 10C have a p-type impurity concentration higher than the LDD regions of the n-type driver circuit TFT 10A1. Therefore, the resistance of the LDD regions of the n-type pixel TFT 10C is greater than that of the LDD regions of the n-type driver circuit TFT 10A1. Thus, the on-current of the n-type pixel TFT 10C is smaller than that of the n-type driver circuit TFT 10A1.

Next, the TFT substrates 100B to 100D will be described.

The TFT substrate 100B shown in FIGS. 1(b) and 3(a) has the first insulating layer 21 formed on the insulating substrate (a glass substrate, for example) 11, and an n-type driver circuit TFT 10A2, a p-type driver circuit TFT 10B, and an n-type pixel TFT 10C formed on the first insulating layer 21.

The n-type driver circuit TFT 10A2 is provided with a crystalline semiconductor layer 30A2 including a channel region 33A2, a source region 34A2, and a drain region 35A2. The n-type driver circuit TFT 10A2 is also provided with the gate electrode 51, which controls the conductivity of the channel region 33A2, and the second insulating layer 22 formed below the gate electrode 51. The crystalline semiconductor layer 30A2 has first lightly doped drain regions (LDD regions) 31A2 and 32A2 formed between the channel region 33A2 and the source region 34A2, and the channel region 33A2 and the drain region 35A2, respectively. It is possible to form only one of the first lightly doped drain regions 31A2 and 32A2. In addition, the n-type driver circuit TFT 10A2 has the regions 36A2 and 37A2 formed between the first lightly doped drain regions 31A2 and 32A2, and the channel region 33A2. It is possible to form only one of the regions 36A2 and 37A2. The first lightly doped drain regions 31A2 and 32A2 have first conductive-type (n-type, for example) impurities (phosphorus (P), for example) at a first impurity concentration $C_1$ (between $5\times10^{17}$ cm$^{-3}$ and $3\times10^{18}$ cm$^{-3}$ inclusive, for example, and $1\times10^{18}$ cm$^{-3}$ in the present embodiment), and second conductive-type (p-type for example) impurities (boron (B), for example) at a concentration lower than the first impurity concentration $C_1$ (between $3\times10^{16}$ cm$^{-3}$ and $3\times10^{17}$ cm$^{-3}$ inclusive, for example, and $6\times10^{16}$ cm$^{-3}$ in the present embodiment). The channel region 33A2 has the second conductive-type impurities at a second impurity concentration $C_2$ (between $3\times10^{16}$ cm$^{-3}$ and $3\times10^{17}$ cm$^{-3}$ inclusive, for example, and $2\times10^{17}$ cm$^{-3}$ in the present embodiment), which is lower than the first impurity concentration $C_1$. The source region 34A2 and the drain region 35A2 have the first conductive-type impurities at a concentration higher than the first impurity concentration $C_1$ (between $6\times10^{18}$ cm$^{-3}$ and $6\times10^{20}$ cm$^{-3}$ inclusive, for example, and $1\times10^{20}$ cm$^{-3}$ in the present embodiment). The regions 36A2 and 37A2 have the second conductive-type impurities at a concentration lower than the second impurity concentration $C_2$ (at least $3\times10^{16}$ cm$^{-3}$ and less than $3\times10^{17}$ cm$^{-3}$, for example, and $6\times10^{16}$ cm$^{-3}$ in the present embodiment). The n-type driver circuit TFT 10A2 has the third insulating layer 23 formed above the crystalline semiconductor layer 30A2 and additionally has the fourth insulating layer 24 formed on the third insulating layer 23. The n-type driver circuit TFT 10A2 has the source electrode 52 connected to the source region 34A2, and the drain electrode 53 connected to the drain region 35A2.

The TFT substrate 100C shown in FIGS. 2(a) and 3(b) has the first insulating layer 21 formed on the insulating substrate (a glass substrate, for example) 11, and an n-type driver circuit TFT 10A3, a p-type driver circuit TFT 10B, and an n-type pixel TFT 10C formed on the first insulating layer 21.

The n-type driver circuit TFT 10A3 is provided with a crystalline semiconductor layer 30A3 including a channel region 33A3, a source region 34A3, and a drain region 35A3. The n-type driver circuit TFT 10A3 is also provided with the gate electrode 51, which controls the conductivity of the channel region 33A3, and the second insulating layer 22 formed below the gate electrode 51. The crystalline semiconductor layer 30A3 has first lightly doped drain regions (LDD regions) 31A3 and 32A3 formed between at least either of the channel region 33A3 and the source region 34A3, and the channel region 33A3 and the drain region 35A3. It is possible to form only one of the first lightly doped drain regions 31A3 and 32A3. In addition, the n-type driver circuit TFT 10A3 has lightly doped drain regions 38A3 and 39A3 respectively formed between the first lightly doped drain regions 31A3 and 32A3, and the channel region 33A3. It is possible to form only one of the lightly doped drain regions 38A3 and 39A3. The first lightly doped drain regions 31A3 and 32A3 have the first conductive-type (n-type, for example) impurities (phosphorus (P), for example) at a first impurity concentration $C_1$ (between $5\times10^{17}$ cm$^{-3}$ and $3\times10^{18}$ cm$^{-3}$ inclusive, for example, and $1\times10^{18}$ cm$^{-3}$ in the present embodiment), and the second conductive-type (p-type, for example) impurities (boron (B), for example) at a concentration lower than the first impurity concentration $C_1$ (between $3\times10^{16}$ cm$^{-3}$ and $3\times10^{17}$ cm$^{-3}$ inclusive, for example, and $6\times10^{16}$ cm$^{-3}$ in the present embodiment). The channel region 33A3 has the second conductive-type impurities at a second impurity concentration $C_2$ (between $3\times10^{16}$ cm$^{-3}$ and $3\times10^{17}$ cm$^{-3}$ inclusive, for example, and $6\times10^{16}$ cm$^{-3}$ in the present embodiment), which is lower than the first impurity concentration $C_1$. The source region 34A3 and the drain region 35A3 have the first conductive-type impurities at a concentration higher than the first impurity concentration $C_1$ (between $6\times10^{18}$ cm$^{-3}$ and $6\times10^{20}$ cm$^{-3}$ inclusive, for example, and $1\times10^{20}$ cm$^{-3}$ in the present embodiment). The lightly doped drain regions 38A3 and 39A3 have the first conductive-type impurities at the first impurity concentration $C_1$ and the second conductive-type impurities at the second impurity concentration $C_2$. The n-type driver circuit TFT 10A3 has the third insulating layer 23 formed above the crystalline semiconductor layer 30A3 and additionally has the fourth insulating layer 24 formed on the third insulating layer 23. The n-type driver circuit TFT 10A3 has the source electrode 52 connected to the source region 34A3, and the drain electrode 53 connected to the drain region 35A3.

The TFT substrate 100D shown in FIGS. 2(b) and 3(c) has the first insulating layer 21 formed on the insulating substrate (a glass substrate, for example) 11, and an n-type driver circuit TFT 10A4, a p-type driver circuit TFT 10B, and an n-type pixel TFT 10C formed on the first insulating layer 21.

The n-type driver circuit TFT 10A4 is provided with a crystalline semiconductor layer 30A4 including a channel region 33A4, a source region 34A4, and a drain region 35A4. The n-type driver circuit TFT 10A4 is also provided with the gate electrode 51, which controls the conductivity of the channel region 33A4, and the second insulating layer 22 formed below the gate electrode 51. The crystalline semiconductor layer 30A4 has first lightly doped drain regions (LDD regions) 31A4 and 32A4 formed between the channel region 33A4 and the source region 34A4, and between the channel region 33A4 and the drain region 35A4. It is possible to form only one of the first lightly doped drain regions 31A4 and 32A4. In addition, the n-type driver circuit TFT 10A4 has a region 36A4 formed between a first lightly doped drain region 31A4 (or 32A4) and the channel region 33A4. In addition, the n-type driver circuit TFT 10A4 has a lightly doped drain region 38A4 formed between the first lightly doped drain region 32A4 (or 31A4) and the channel region 33A4. The first lightly doped drain regions 31A4 and 32A4 have the first conductive-type (n-type, for example) impurities (phosphorus (P), for example) at a first impurity concentration $C_1$ (between $5\times10^{17}$ cm$^{-3}$ and $3\times10^{18}$ cm$^{-3}$ inclusive, for example, and $1\times10^{18}$ cm$^{-3}$ in the present embodiment), and the second conductive-type (p-type, for example) impurities (boron (B), for example) at a concentration lower than the first impurity concentration $C_1$ (between $3\times10^{16}$ cm$^{-3}$ and $3\times10^{17}$ cm$^{-3}$ inclusive, for example, and $6\times10^{16}$ cm$^{-3}$ in the present invention). The channel region 33A4 has the second conductive-type impurities at a second impurity concentration $C_2$ (between $3\times10^{16}$ cm$^{-3}$ and $3\times10^{17}$ cm$^{-3}$ inclusive, for example, and $2\times10^{17}$ cm$^{-3}$ in the present embodiment), which is lower than the first impurity concentration $C_1$. The source region 34A4 and the drain region 35A4 have the first conductive-type impurities at a concentration higher than the first impurity concentration $C_1$ (between $6\times10^{18}$ cm$^{-3}$ and $6\times10^{20}$ cm$^{-3}$ inclusive, for example, and $1\times10^{20}$ cm$^{-3}$ in the present embodiment). The region 36A4 has the second conductive-type impurities at a concentration lower than the second impurity concentration $C_2$ (at least $3\times10^{16}$ cm$^{-3}$ and less than $3\times10^{17}$ cm$^{-3}$, for example, and $6\times10^{16}$ cm$^{-3}$ in the present embodiment). The lightly doped drain region 38A4 has the first conductive-type impurities at the first impurity concentration $C_1$ and the second conductive-type impurities at the second impurity concentration $C_2$. The second conductive-type impurity concentration of the region 36A4 is lower than the second conductive-type impurity concentration of the lightly doped drain region 38A4. The n-type driver circuit TFT 10A4 has the third insulating layer 23 formed above the crystalline semiconductor layer 30A4 and additionally has the fourth insulating layer 24 formed on the third insulating layer 23. The n-type driver circuit TFT 10A4 has the source electrode 52 connected to the source region 34A4, and the drain electrode 53 connected to the drain region 35A4.

The first insulating layer 21, the second insulating layer 22, and the third insulating layer 23 are formed of a silicon nitride ($SiN_x$) or silicon dioxide ($SiO_2$), for example.

The fourth insulating layer 24 is formed of a silicon nitride ($SiN_x$), silicon dioxide ($SiO_2$), or a photosensitive organic insulating film material, for example.

The gate electrode 51, the source electrode 52, and the drain electrode 53 are formed of a metal with a high melting point such as any one of W, Ta, Ti, Mo, or an alloy thereof, for example.

The pixel electrode 54 is a transparent electrode such as ITO (indium tin oxide), for example.

By configuring the TFT substrate 100 as described above, it is possible to form TFTs, which need to have different TFT properties, by a simple manufacturing method when forming TFTs that need to have different properties on the same substrate. Also, the manufacturing cost can be reduced. The n-type driver circuit TFT 10A is provided with low resistance LDD regions (first lightly doped drain regions 31A1 to A4 and 32A1 to A4), and thus, it is possible to reduce the off-current without reducing the on-current. The p-type driver circuit TFT 10B does not have a lightly doped drain region (LDD region), and thus, the on-current is not reduced, and it is possible to reduce the size of the TFT because the lightly doped drain region (LDD region) is not formed therein. The n-type pixel TFT 10C has LDD regions (second lightly doped drain regions 31C and 32C) with higher resistance than the LDD regions of the n-type driver circuit TFT 10A, and thus, the off-current is reduced.

Next, manufacturing methods of an embodiment of the present invention will be described with reference to FIGS. 4 to 9.

First, a method of manufacturing the n-type driver circuit TFT 10A1 will be described.

As shown in FIG. 4(a), the first insulating layer 21, which is made of a silicon nitride ($SiN_x$) or silicon dioxide ($SiO_2$), for example, is formed on the insulating substrate (a glass substrate, for example) 11 by the CVD (chemical vapor deposition) method, for example, to a thickness of between 50 nm and 400 nm inclusive, for example. Next, an amorphous semiconductor layer (an amorphous silicon layer (a-Si layer), for example) 30' (not shown in drawings) is formed on the first insulating layer 21 by a known method. The thickness of the amorphous semiconductor layer 30' is between 30 nm and 200 nm inclusive, for example. Next, the amorphous semiconductor layer 30' is crystallized by a known method L1, thus forming a crystalline semiconductor layer (a polycrystalline silicon layer (p-Si layer), for example) 30.

Next, as shown in FIG. 4(b), an island-shaped crystalline semiconductor layer 30A1 is formed by patterning the crystalline semiconductor layer 30 by a known method. Then, as shown in FIG. 4(c), a second insulating layer (gate insulating layer) 22 is formed by a known method so as to cover the entire surface of the island-shaped crystalline semiconductor layer 30A1. The second insulating layer (gate insulating layer) 22 is formed of a silicon nitride ($SiN_x$) or silicon dioxide ($SiO_2$), for example. The thickness of the second insulating layer 22 is between 30 nm and 300 nm inclusive, for example.

Next, the entire surface of the island-shaped crystalline semiconductor layer 30A1 is doped with p-type impurities (boron (B), for example) p1 by a known method, at a voltage of 25 kV and a dose of $1 \times 10^{12}$ $cm^{-2}$, for example. A mask is not formed using a photoresist at this time. The step of conducting doping with the p-type impurities p1 may be omitted in some cases. These steps are in common between the n-type driver circuit TFT 10A1, the p-type driver circuit TFT 10B, and the n-type pixel TFT 10C.

Next, as shown in FIG. 4(d), a photoresist 71 is formed so as to cover regions except for the region where the channel region 33A1 of the island-shaped crystalline semiconductor layer 30A1 is to be formed. Then, the region where the channel region 33A1 of the island-shaped crystalline semiconductor layer 30A1 is to be formed is doped with the p-type impurities p2. It is preferable that the conditions by which doping with the p-type impurities p2 is conducted be a voltage of 25 kV and a dose of between $5 \times 10^{11}$ $cm^{-2}$ and $5 \times 10^{12}$ $cm^{-2}$ inclusive. The conditions by which doping with the p-type impurities p2 is conducted are a voltage of 25 kV and a dose of $3 \times 10^{12}$ $cm^{-2}$, for example.

Next, the photoresist 71 is removed.

Next, as shown in FIG. 4(e), a first electrode (gate electrode) 51 is formed on the second insulating layer 22, by a known method. The first electrode 51 is formed of a metal with a high melting point such as any one of W, Ta, Ti, Mo, or an alloy thereof, for example. The thickness of the first electrode 51 is between 200 nm and 800 nm inclusive, for example. Then, the island-shaped crystalline semiconductor layer 30A1 is doped with n-type impurities n1 (phosphorus (p), for example) in a self-aligned manner with respect to the first electrode 51. It is preferable that the conditions by which doping with the n-type impurities n1 is conducted be a voltage of 80 kV and a dose of between $5 \times 10^{12}$ $cm^{-2}$ and $3 \times 10^{13}$ $cm^{-2}$ inclusive. The conditions by which doping with the n-type impurities n1 is conducted are a voltage of 80 kV and a dose of $1 \times 10^{13}$ $cm^{-2}$, for example.

Next, as shown in FIG. 5(a), a photoresist 74 is formed by a known method so as to cover regions where first lightly doped drain regions (LDD regions) 31A1 and 32A1 are to be formed. Then, the island-shaped crystalline semiconductor layer 30A1 is doped with the n-type impurities n2. As a result, a source region 34A1 and a drain region 35A1 are formed in the island-shaped crystalline semiconductor layer 30A1. A first lightly doped drain region 31A1 is formed between the source region 34A1 and the channel region 33A1, and a first lightly doped drain region 32A1 is formed between the drain region 35A1 and the channel region 33A1. It is possible to form only one of the first lightly doped drain regions 31A1 and 32A1. It is preferable that the conditions by which doping with the n-type impurities n2 is conducted be a voltage of 45 kV and a dose of between $1 \times 10^{14}$ $cm^{-2}$ and $1 \times 10^{16}$ $cm^{-2}$ inclusive. The conditions by which doping with the n-type impurities n2 is conducted are a voltage of 45 kV and a dose of $2 \times 10^{15}$ $cm^{-2}$, for example. Doping with the n-type impurities n2 may be conducted before the first electrode 51 is formed.

Next, the photoresist 74 is removed.

Next, as shown in FIG. 5(b), a photoresist 76 is formed by a known method so as to cover at least the island-shaped crystalline semiconductor layer 30A1. Then, the island-shaped crystalline semiconductor layer 30B is doped with p-type impurities p3 for forming a source region 34B and a drain region 35B in the island-shaped crystalline semiconductor layer 30B. However, since the island-shaped crystalline semiconductor layer 30A1 is covered by the photoresist 76, the island-shaped crystalline semiconductor layer 30A1 is not doped with the p-type impurities p3. It is preferable that the conditions by which doping with the p-type impurities p3 is conducted be a voltage of 80 kV and a dose of between $5 \times 10^{14}$ $cm^{-2}$ and $2 \times 10^{16}$ $cm^{-2}$ inclusive. The conditions by which doping with the p-type impurities p3 is conducted are a voltage of 80 kV and a dose of $1.3 \times 10^{15}$ $cm^{-2}$, for example.

Next, the photoresist 76 is removed. Then, the crystalline semiconductor layer 30A1 is activated by a known method.

Next, as shown in FIG. 5(c), a third insulating layer 23 is formed above the island-shaped crystalline semiconductor layer 30A1 by a known method. The third insulating layer 23 is formed of a silicon nitride ($SiN_x$) or silicon dioxide ($SiO_2$), for example. The thickness of the third insulating layer 23 is between 300 nm and 1000 nm inclusive, for example. Then, the third insulating layer 23 is annealed and hydrogenated by a known method. The annealing may be conducted after contact holes to be described below are formed, or after the source electrode and the drain electrode are formed.

Next, as shown in FIG. 5(d), contact holes are formed by a known method so as to penetrate the second insulating layer 22 and the third insulating layer 23. Then, a source electrode 52 that is formed on the third insulating layer 23 and that is connected to the source region 34A1, and a drain electrode 53 that is formed on the third insulating layer 23 and that is connected to the drain region 35A1 are formed. The source electrode 52 and the drain electrode 53 are made of a metal with a high melting point such as any one of W, Ta, Ti, Mo, or an alloy thereof, for example. The thickness of the source electrode 52 and the drain electrode 53 is between 200 nm and 800 nm inclusive, for example.

Next, the fourth insulating layer 24 is formed on the third insulating layer 23 by a known method, thus forming the n-type driver circuit TFT 10A1 shown in FIG. 1(a). The fourth insulating layer 24 is made of a photosensitive organic insulating film material, for example. The thickness of the fourth insulating layer 24 is between 1000 nm and 3000 nm inclusive, for example.

Next, the method for manufacturing the p-type driver circuit TFT 10B will be described. Components in common with the n-type driver circuit TFT 10A1 will be assigned the same reference characters, and redundant descriptions will be omitted.

The island-shaped crystalline semiconductor layer 30B is formed on the insulating substrate 11, and the second insulating layer 22 is formed on the island-shaped crystalline semiconductor layer 30B. Then, the entire surface of the island-shaped crystalline semiconductor layer 30B is doped with the p-type impurities p1. The island-shaped crystalline semiconductor layer 30B does not need to be doped with the p-type impurities p1 in some cases.

Next, as shown in FIG. 4(d), a photoresist 72 is formed so as to cover at least the entire surface of the island-shaped crystalline semiconductor layer 30B. Then, the region where the channel region 33A1 is to be formed on the island-shaped crystalline semiconductor layer 30A1 is doped with the p-type impurities p2. At this time, the island-shaped crystalline semiconductor layer 30B is not doped with the p-type impurities p2 because of the photoresist 72.

Next, the photoresist 72 is removed.

Next, as shown in FIG. 4(e), the first electrode (gate electrode) 51 is formed on the second insulating layer 22 by a known method. The island-shaped crystalline semiconductor layer 30B is doped with the impurities (phosphorus (P), for example) n1 in a self-aligned manner with respect to the first electrode 51.

Next, as shown in FIG. 5(a), a photoresist 73 is formed by a known method so as to cover the island-shaped crystalline semiconductor layer 30B. Then, the island-shaped crystalline semiconductor layer 30A1 is doped with the n-type impurities n2. However, the island-shaped crystalline semiconductor layer 30B is not doped with the n-type impurities n2 because of the photoresist 73.

Next, the photoresist 73 is removed.

Next, as shown in FIG. 5(b), the island-shaped crystalline semiconductor layer 30B is doped with the p-type impurities p3, thus forming the source region 34B and the drain region 35B. The source region 34B and the drain region 35B are formed in a self-aligned manner with respect to the gate electrode 51. Lightly doped drain regions (LDD regions) are not formed on the island-shaped crystalline semiconductor layer 30B.

Then, as described above, the third insulating layer 23, the fourth insulating layer 24, the source electrode 52, and the drain electrode 53 are formed.

Next, a method for manufacturing the n-type pixel TFT 10C will be described. Components in common with the n-type driver circuit TFT 10A1 will be assigned the same reference characters, and redundant descriptions will be omitted.

The island-shaped crystalline semiconductor layer 30C is formed on the insulating substrate 11, and the second insulating layer 22 is formed on the island-shaped crystalline semiconductor layer 30C. Then, the entire surface of the island-shaped crystalline semiconductor layer 30C is doped with the p-type impurities p1. The island-shaped crystalline semiconductor layer 30C does not need to be doped with the p-type impurities p1 in some cases.

Next, as shown in FIG. 4(d), the entire surface of the island-shaped crystalline semiconductor layer 30C is doped with the p-type impurities p2.

Next, as shown in FIG. 4(e), the first electrode (gate electrode) 51 is formed on the second insulating layer 22 by a known method. Then, the island-shaped crystalline semiconductor layer 30C is doped with the n-type impurities (phosphorus (P), for example) n1 in a self-aligned manner with respect to the first electrode 51.

Next, as shown in FIG. 5(a), a photoresist 75 is formed by a known method so as to cover the regions where the second lightly doped drain regions (LDD regions) 31C and 32C are to be formed. Then, the island-shaped crystalline semiconductor layer 30C is doped with the n-type impurities n2. As a result, a source region 34C and a drain region 35C are formed on the island-shaped crystalline semiconductor layer 30C. The second lightly doped drain region 31C is formed between the source region 34C and the channel region 33C, and the second lightly doped drain region 32C is formed between the drain region 35C and the channel region 33C. Doping with the n-type impurities n2 may be conducted before the first electrode (gate electrode) 51 is formed. It is possible to form only one of the second lightly doped drain regions 31C and 32C. The second lightly doped drain regions (LDD regions) 31C and 32C have both n-type impurities n1 and p-type impurities p2.

Next, the photoresist 75 is removed.

Next, as shown in FIG. 5(b), a photoresist 77' is formed by a known method so as to cover the island-shaped crystalline semiconductor layer 30C. Then, the island-shaped crystalline semiconductor layer 30B is doped with the p-type impurities p3 so as to form the source region 34B and the drain region 35B. However, the island-shaped crystalline semiconductor layer 30C is not doped with the p-type impurities p3 because of the photoresist 77'.

Next, the photoresist 77' is removed.

Next, as described above, the third insulating layer 23, the fourth insulating layer 24, the source electrode 52, and the drain electrode 53 are formed.

Next, a pixel electrode 54 is formed on the fourth insulating layer 24 by a known method.

Next, another method for manufacturing the n-type driver circuit TFT 10A1, the p-type driver circuit TFT 10B, and the n-type pixel TFT 10C shown in FIG. 1(a) will be described with reference to FIG. 6.

Figure 6:
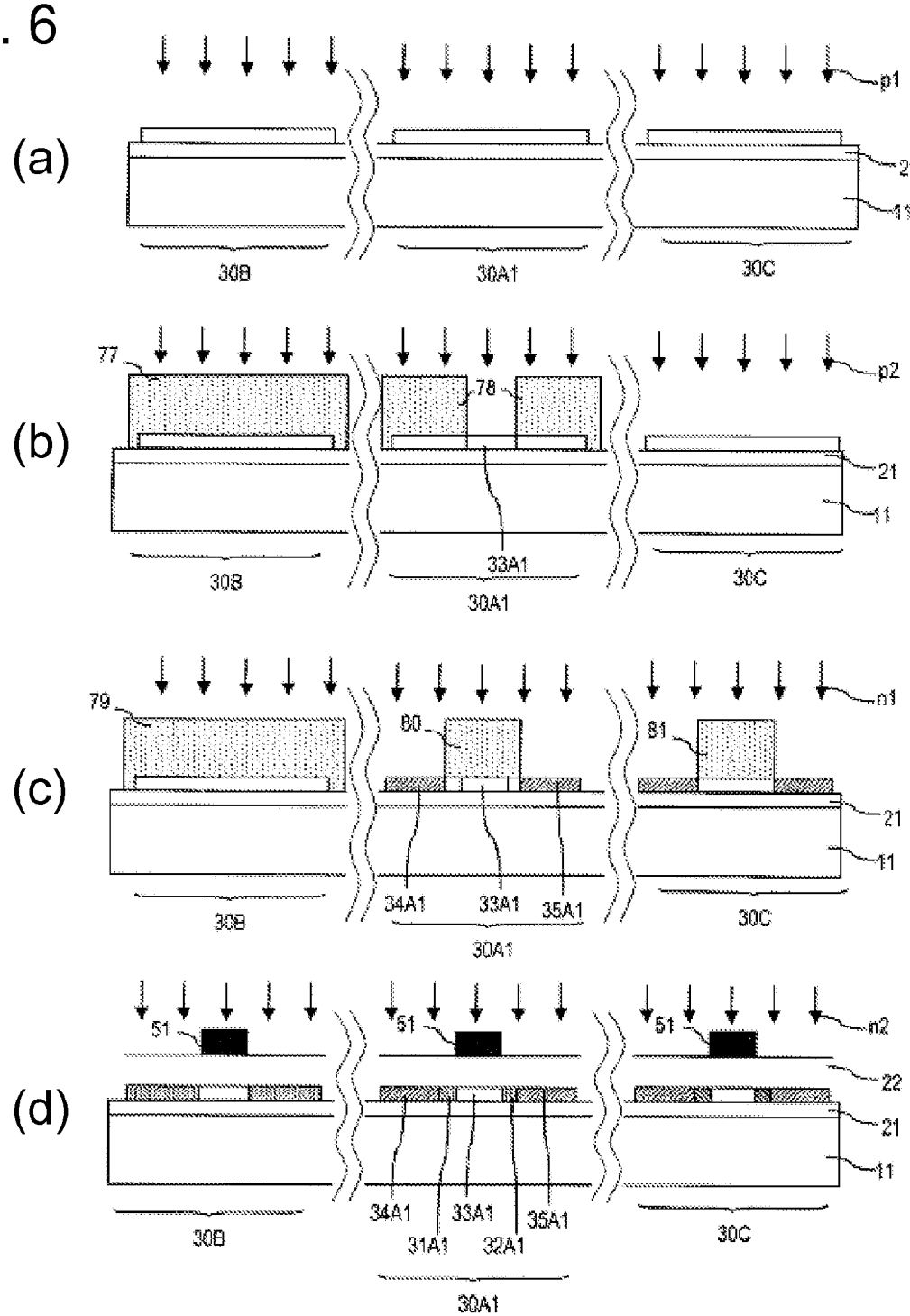
FIGS. 6(a) to 6(d) are cross-sectional views that show other manufacturing steps for the TFT substrate 100A.

The manufacturing method shown in FIG. 6 is a method for doping the desired island-shaped crystalline semiconductor layers 30A1, 30B, and 30C with the n-type impurities n1, and the p-type impurities p1 and p2, before the second insulating layer (gate insulating layer) 22 is formed.

First, as described above, the first insulating layer 21 and the island-shaped crystalline semiconductor layers 30A1, 30B, and 30C are respectively formed on the insulating substrate 11.

Next, as shown in FIG. 6(a), the entire surfaces of the island-shaped crystalline semiconductor layers 30A1, 30B, and 30C are doped with the p-type impurities p1. The conditions by which doping with the p-type impurities p1 is conducted are a voltage of 13 kV and a dose of $1\times10^{12}$ cm$^{-2}$, for example. The island-shaped crystalline semiconductor layers 30A1, 30B, and 30C do not need to be doped with the p-type impurities p1 in some cases.

Next, as shown in FIG. 6(b), a photoresist 77 is formed by a known method so as to cover the entire surface of the island-shaped crystalline semiconductor layer 30B. At the same time, a photoresist 78 is formed by a known method so as to cover regions except for where the channel region 33A1 of the island-shaped crystalline semiconductor layer 30A1 is to be formed. Then, the entire surface of the island-shaped crystalline semiconductor layer 30C and the region in the island-shaped crystalline semiconductor layer 30A1 where the channel region 33A1 is to be formed are doped with the p-type impurities p2. It is preferable that the conditions by which doping with the p-type impurities p2 is conducted be a voltage of 13 kV and a dose of between $5\times10^{11}$ cm$^{-2}$ and $5\times10^{12}$ cm$^{-2}$ inclusive. The conditions by which doping with the p-type impurities p2 is conducted are a voltage of 13 kV and a dose of $3\times10^{12}$ cm$^{-2}$, for example.

Next, the photoresists 77 and 78 are removed.

Next, as shown in FIG. 6(c), a photoresist 79 is formed so as to cover the entire surface of the island-shaped crystalline semiconductor layer 30B. At the same time, a photoresist 80 is formed so as to cover regions where the channel region 33A1 and the first lightly doped drain region of the island-shaped crystalline semiconductor layer 30A1 are to be formed. In addition, a photoresist 81 is formed so as to cover the regions where the channel region and the second lightly doped drain region of the island-shaped crystalline semiconductor layer 30C are to be formed. Then, the regions where the source region 34A1 and the drain region 35A1 of the island-shaped crystalline semiconductor layer 30A1 are to be formed and the regions where the source region and the drain region of the crystalline semiconductor layer 30C are to be formed are doped with the n-type impurities n1. It is preferable that the conditions by which doping with the n-type impurities n1 is conducted be a voltage of 20 kV and a dose of between $5\times10^{13}$ cm$^{-2}$ and $1\times10^{15}$ cm$^{-2}$ inclusive. The conditions by which doping with the n-type impurities n1 is conducted are a voltage of 20 kV and a dose of $2\times10^{14}$ cm$^{-2}$, for example.

Then, the photoresists 79, 80, and 81 are removed.

Next, as shown in FIG. 6(d), the second insulating layer (gate insulating layer) 22 and the gate electrode 51 are formed by a known method. Then, the island-shaped crystalline semiconductor layer 30A1, the crystalline semiconductor layer 30B, and the crystalline semiconductor layer 30C are doped with the n-type impurities n2 in a self-aligned manner with respect to the gate electrode 51 of each crystalline semiconductor layer. As a result, the first lightly doped drain regions 31A1 and 32A1, the source region 34A1, and the drain region 35A1 are formed in the island-shaped crystalline semiconductor layer 30A1. At the same time, the second lightly doped drain region, the source region, and the drain region are formed in the island-shaped crystalline semiconductor layer 30C. It is preferable that the conditions by which doping with the n-type impurities n2 is conducted be a voltage of 80 kV and a dose of between $5\times10^{12}$ cm$^{-2}$ and $3\times10^{13}$ cm$^{-2}$ inclusive. The conditions by which doping with the n-type impurities n2 is conducted are a voltage of 80 kV and a dose of $1\times10^{13}$ cm$^{-2}$, for example. Then, the n-type driver circuit TFT 10A1, the p-type driver circuit TFT 10B, and the n-type pixel TFT 10C shown in FIG. 1(a) are formed by the above-mentioned method. Therefore, there are at least two methods for manufacturing the n-type driver circuit TFT 10A1, the p-type driver circuit TFT 10B, and the n-type pixel TFT 10C. Similarly, there are at least two manufacturing methods for the n-type driver circuit TFTs 10A2 to 10A4 to be described below.

Figure 7:
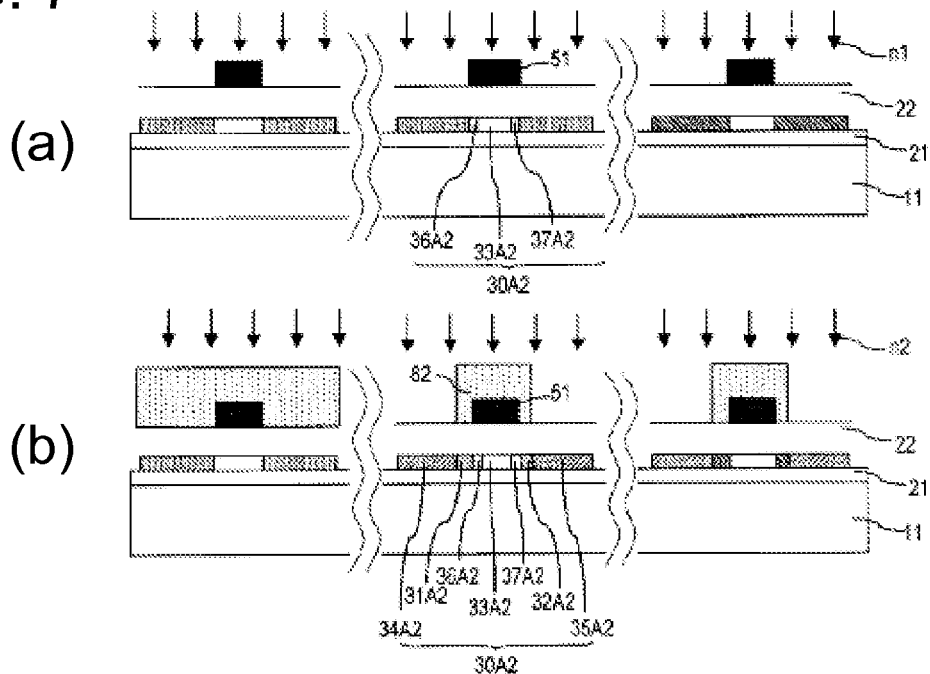
FIGS. 7(a) and 7(b) are cross-sectional views that show manufacturing steps for the TFT substrate 100B.
Figure 8:
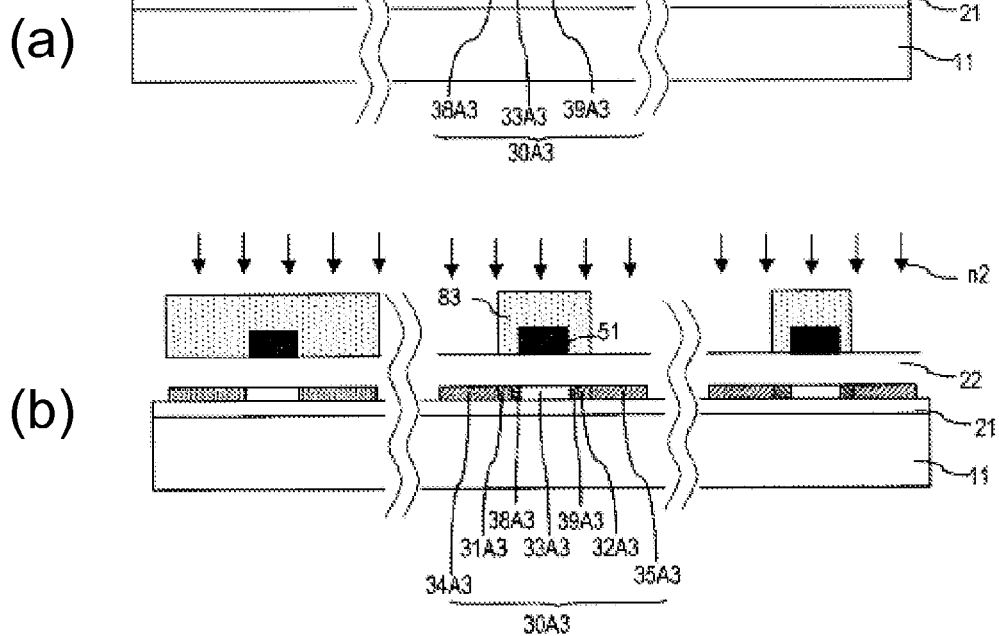
FIGS. 8(a) and 8(b) are cross-sectional views that show manufacturing steps for the TFT substrate 100C.
Figure 9:
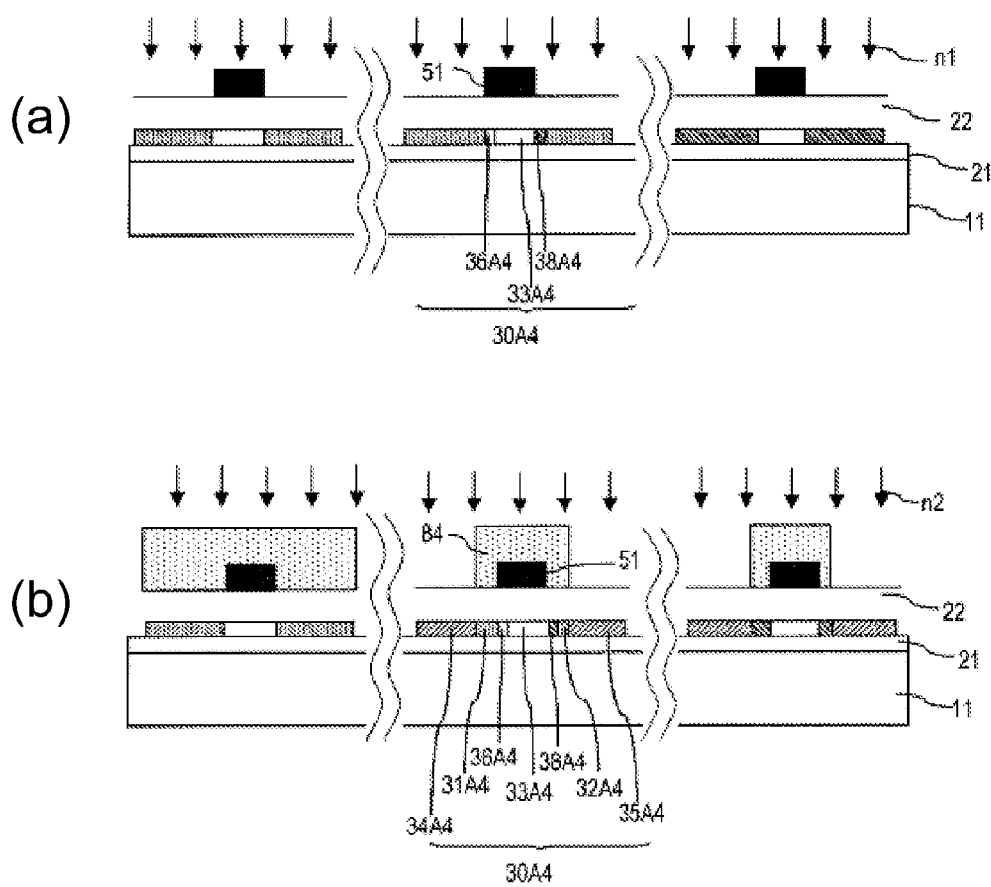
FIGS. 9(a) and 9(b) are cross-sectional views that show manufacturing steps for the TFT substrate 100D.

Next, the n-type driver circuit TFT 10A2 shown in FIG. 1(b) will be described with reference to FIG. 7. Descriptions of the p-type driver circuit TFT 10B and the n-type pixel TFT 10C, which are formed at the same time, will be omitted.

The island-shaped crystalline semiconductor layer 30A2 is formed on the insulating substrate 11, and the second insulating layer (gate insulating layer) 22 is formed on the island-shaped crystalline semiconductor layer 30A2, by the above-mentioned method. Then, the island-shaped crystalline semiconductor layer 30A2 is doped with the p-type impurities p1 and p2, by the above-mentioned method. Doping with the p-type impurities p1 does not need to be conducted in some cases.

Next, the first electrode (gate electrode) 51 is formed on the second insulating layer 22 by a known method. Next, the channel region 33A2 is formed on the island-shaped crystalline semiconductor layer 30A2 by the above-mentioned method. The first electrode 51 is longer than the channel region 33A2.

Next, as shown in FIG. 7(a), the island-shaped crystalline semiconductor layer 30A2 is doped with the n-type impurities n1 in a self-aligned manner with respect to the first electrode 51. At this time, regions 36A2 and 37A2, which are not doped with the p-type impurities p2 and the n-type impurities n1, are formed in the island-shaped crystalline semiconductor layer 30A2 as a result of misalignment or the like between the photoresist (corresponding to the photoresist 71 in FIG. 4(d), for example), which contributes to the formation of the channel region 33A2 of the island-shaped crystalline semiconductor layer 30A2, and the first electrode 51. The region 36A2 is formed between the channel region 33A2 and the source region 34A2, which will be described below. The region 37A2 is formed between the channel region 33A2 and the drain region 35A2, which will be described below. In some cases, only one of the regions 36A2 and 37A2 is formed. Also, the concentration of p-type impurities in the regions 36A2 and 37A2 is lower than the concentration of p-type impurities in the channel region 33A2. It is preferable that the conditions by which doping with the n-type impurities n1 is conducted be a voltage of 80 kV and a dose of between $5\times10^{12}$ cm$^{-2}$ and $3\times10^{13}$ cm$^{-2}$ inclusive. The conditions by which doping with the n-type impurities n1 is conducted are a voltage of 80 kV and a dose of $1\times10^{13}$ cm$^{-2}$, for example. As described above, doping with the n-type impurities n1 and the p-type impurities p1 and p2 may be conducted before the second insulating layer (gate insulating layer) 22 is formed.

Next, as shown in FIG. 7(b), a photoresist 82 is formed so as to cover the regions where the first lightly doped drain regions 31A2 and 32A2 of the island-shaped crystalline semiconductor layer 30A2 are to be formed. Then, the island-shaped crystalline semiconductor layer 30A2 is doped with the n-type impurities n2, thus forming the first lightly doped drain regions 31A2 and 32A2, the source region 34A2, and the drain region 35A2. The first lightly doped drain region 31A2 is formed between the region 36A2 and the source region 34A2, and the first lightly doped drain region 32A2 is formed between the region 37A2 and the drain region 35A2. The concentration of n-type impurities in the first lightly doped drain regions 31A2 and 32A2 is lower than the concentration of n-type impurities in the source region 34A2 and the drain region 35A2. It is possible to form only one of the first lightly doped drain regions 31A2 and 32A2. It is preferable that the conditions by which doping with the n-type impurities n2 is conducted be a voltage of 45 kV and a dose of between $1 \times 10^{14}$ cm$^{-2}$ and $1 \times 10^{16}$ cm$^{-2}$ inclusive. The conditions by which doping with the n-type impurities n2 is conducted are a voltage of 45 kV and a dose of $2 \times 10^{15}$ cm$^{-2}$, for example.

Next, the photoresist 82 is removed.

Then, the n-type driver circuit TFT 10A2 shown in FIG. 1(b) is formed by the above-mentioned method.

Next, the method of manufacturing the n-type driver circuit TFT 10A3 shown in FIG. 2(a) will be described. Descriptions of the p-type driver circuit TFT 10B and the n-type pixel TFT 10C, which are formed at the same time, will be omitted.

The island-shaped crystalline semiconductor layer 30A3 is formed on the insulating substrate 11, and the second insulating layer (gate insulating layer) 22 is formed on the island-shaped crystalline semiconductor layer 30A3, by the above-mentioned method. Then, the island-shaped crystalline semiconductor layer 30A3 is doped with the p-type impurities p1 and p2 by the above-mentioned method. Doping with the p-type impurities p1 does not need to be conducted in some cases.

Next, the first electrode (gate electrode) 51 is formed on the second insulating layer 22 by a known method. The channel region 33A3 is formed in the island-shaped crystalline semiconductor layer 30A3 by the above-mentioned method. The gate electrode 51 is shorter than the channel region 33A3.

Next, as shown in FIG. 8(a), the island-shaped crystalline semiconductor layer 30A3 is doped with the n-type impurities n1 in a self-aligned manner with respect to the first electrode 51. At this time, the lightly doped drain regions 38A3 and 39A3 are formed in the island-shaped crystalline semiconductor layer 30A3 as a result of being doped with the n-type impurities n1 in the regions formed by the misalignment or the like between the photoresist (corresponding to the photoresist 71 in FIG. 4(d), for example), which contributes to the formation of the channel region 33A3 in the island-shaped crystalline semiconductor layer 30A3, and the gate electrode 51. The lightly doped drain regions 38A3 and 39A3 have both the p-type impurities p2 and the n-type impurities n1. The lightly doped drain region 38A3 is formed between the channel region 33A3 and the source region 34A3, and the lightly doped drain region 39A3 is formed between the channel region 33A3 and the drain region 35A3. In some cases, only one of the lightly doped drain regions 38A3 and 39A3 is formed. It is preferable that the conditions by which doping with the n-type impurities n1 is conducted be a voltage of 80 kV and a dose of between $5 \times 10^{12}$ cm$^{-2}$ and $3 \times 10^{13}$ cm$^{-2}$ inclusive. The conditions by which doping with the n-type impurities n1 is conducted are a voltage of 80 kV and a dose of $1 \times 10^{13}$ cm$^{-2}$, for example. As described above, doping with the n-type impurities n1 and the p-type impurities p1 and p2 may be conducted before the second insulating layer (gate insulating layer) 22 is formed.

Next, as shown in FIG. 8(b), a photoresist 83 is formed so as to cover regions where the first lightly doped drain regions 31A3 and 32A3 of the island-shaped crystalline semiconductor layer 30A3 are to be formed. Then, the island-shaped crystalline semiconductor layer 30A3 is doped with the n-type impurities n2, thus forming the first lightly doped drain regions 31A3 and 32A3, the source region 34A3, and the drain region 35A3. The first lightly doped drain region 31A3 is formed between the lightly doped drain region 38A3 and the source region 34A3, and the first lightly doped drain region 32A3 is formed between the lightly doped drain region 39A3 and the drain region 35A3. It is possible to form only one of the first lightly doped drain regions 31A3 and 32A3. It is preferable that the conditions by which doping with the n-type impurities n2 is conducted be a voltage of 45 kV and a dose of between $1 \times 10^{14}$ cm$^{-2}$ and $1 \times 10^{16}$ cm$^{-2}$ inclusive. The conditions by which doping with the n-type impurities n2 is conducted are a voltage of 45 kV and a dose of $2 \times 10^{15}$ cm$^{-2}$, for example.

Next, the photoresist 83 is removed.

Then, the n-type driver circuit TFT 10A3 shown in FIG. 2(a) is formed by the above-mentioned method.

Next, the method for manufacturing the n-type driver circuit TFT 10A4 shown in FIG. 2(b) will be described. Descriptions of the p-type driver circuit TFT 10B and the n-type pixel TFT 10C, which are formed at the same time, will be omitted.

The island-shaped crystalline semiconductor layer 30A4 is formed on the insulating substrate 11, and the second insulating layer (gate insulating layer) 22 is formed on the island-shaped crystalline semiconductor layer 30A4, by the above-mentioned method. Then, the island-shaped crystalline semiconductor layer 30A4 is doped with the p-type impurities p1 and p2 by the above-mentioned method. Doping with the p-type impurities p1 does not need to be conducted in some cases.

Next, the gate electrode 51 is formed on the second insulating layer 22 by a known method. Next, the channel region 33A4 is formed in the island-shaped crystalline semiconductor layer 30A4 by the above-mentioned method. The gate electrode 51 is longer than the channel region 33A4 and is formed closer to the region where the source region 34A4 is to be formed. Alternatively, the gate electrode 51 is sometimes formed closer to the region where the drain region 35A4 is to be formed.

Next, as shown in FIG. 9(a), the island-shaped crystalline semiconductor layer 30A4 is doped with the n-type impurities n1 in a self-aligned manner with respect to the gate electrode 51. At this time, a region 36A4, which is not doped with the n-type impurities n1, is formed in a region formed as a result of misalignment or the like between the photoresist (corresponding to the photoresist 71 in FIG. 4(d), for example), which contributes to the formation of the channel region 33A4 of the island-shaped crystalline semiconductor layer 30A4, and the gate electrode 51, and a lightly doped drain region 38A4 is formed on the island-shaped crystalline semiconductor layer 30A4 in the region doped with the n-type impurities n1. The concentration of p-type impurities in the region 36A4 is lower than the concentration of p-type impurities in the channel region 33A4. The lightly doped drain region 38A4 has both the p-type impurities p2 and the n-type impurities n1. The region 36A4 is formed between the channel region 33A4 and the source region 34A4, and the lightly doped drain region 38A4 is formed between the channel region 33A4 and the drain region 35A4. In some cases, the region 36A4 is formed between the channel region 33A4 and the drain region 35A4, and the lightly doped drain region 38A4 is formed between the channel region 33A4 and the source region 34A4. It is preferable that the conditions by which doping with the n-type impurities n1 is conducted be a voltage of 80 kV and a dose of between $5 \times 10^{12}$ cm$^{-2}$ and $3 \times 10^{13}$ cm$^{-2}$ inclusive. The conditions by which doping with the n-type impurities n1 is conducted are a voltage of 80 kV and a dose of $1 \times 10^{13}$ cm$^{-2}$, for example. As described above, doping with the n-type impurities n1 and the p-type impurities p1 and p2 may be conducted before the second insulating layer (gate insulating layer) 22 is formed.

Next, as shown in FIG. 9(b), a photoresist 84 is formed so as to cover the regions where the first lightly doped drain regions 31A4 and 32A4 of the island-shaped crystalline semiconductor layer 30A4 are to be formed. Then, the island-shaped crystalline semiconductor layer 30A4 is doped with the n-type impurities n2, thus forming the first lightly doped drain regions 31A4 and 32A4, the source region 34A4, and the drain region 35A4. The first lightly doped drain region 31A4 is formed between the region 36A4 and the source region 34A4, and the first lightly doped drain region 32A4 is formed between the lightly doped drain region 38A4 and the drain region 35A4. It is possible to form only one of the first lightly doped drain regions 31A4 and 32A4. It is preferable that the conditions by which doping with the n-type impurities n2 is conducted be a voltage of 45 kV and a dose of between $1 \times 10^{14}$ cm$^{-2}$ and $1 \times 10^{16}$ cm$^{-2}$ inclusive. The conditions by which doping with the n-type impurities n2 is conducted are a voltage of 45 kV and a dose of $2 \times 10^{15}$ cm$^{-2}$, for example.

Next, the photoresist 84 is removed.

Then, the n-type driver circuit TFT 10A4 shown in FIG. 2(b) is formed by the above-mentioned method.

By manufacturing the TFT substrates 100 (100A to 100D) in this manner, it is possible to obtain n-type driver circuit TFTs 10A (TFT 10A1 to TFT 10A4) and an n-type pixel TFT 10C having lightly doped drain regions (LDD regions), and these can be manufactured monolithically with the p-type driver circuit TFT 10B that does not have an LDD region. Also, it is possible for the resistance of the lightly doped drain regions (LDD regions) 31A1 to 31A4 and 32A1 to 32A4 of the n-type driver circuit TFT 10A to be different from the resistance of the lightly doped drain regions (LDD regions) 31C and 32C of the n-type pixel TFT 10C, which allows each TFT to be formed without increasing the number of manufacturing steps or photomasks. As a result, a TFT 10A with a small off-current and a large on-current, and an n-type pixel TFT 10C with a small off-current can be obtained. Because a lightly doped drain region (LDD region) is not formed in the p-type driver circuit TFT 10B, the on-current thereof is not reduced, and therefore, the TFT can be made small.

Industrial Applicability

The present invention can be applied to a very wide range of fields, and is applicable to a semiconductor device provided with a TFT or various types of electronic devices that have such a semiconductor device. For example, circuits and parts of pixels formed by implementing the present invention can be used in an active matrix-type liquid crystal display device or an organic EL display device. Such display devices can be used in display screens of mobile telephones or mobile gaming devices, the monitor of a digital camera, or the like. Therefore, the present invention is applicable to all electronic devices with a liquid crystal display device or an organic EL display device built in.

DESCRIPTION OF REFERENCE CHARACTERS 10, 10A, 10A1 to 10A4, 10B, 10C TFT
11 insulating substrate
21, 22, 23, 24 insulating layer
30A1 to 30A4, 30B, 30C crystalline semiconductor layer
33A1 to 33A4, 33B, 33C channel region
34A1 to 34A4, 34B, 34C source region
35A1 to 35A4, 35B, 35C drain region
51 gate electrode
52 source electrode
53 drain electrode
54 pixel electrode
71, 72, 73, 74, 75, 76, 77, 78, 79, 80, 81, 82, 83, 84 photoresist
100, 100A, 100B, 100C, 100D TFT substrate

The invention claimed is:

1. A semiconductor device comprising:
a pixel thin film transistor of a first conductive type;
a driver circuit thin film transistor of the first conductive type;
a driver circuit thin film transistor of a second conductive type that differs from the first conductive type;
a first lightly doped drain region between at least either of a channel region and a source region of the driver circuit thin film transistor of the first conductive type, and the channel region and a drain region of the driver circuit thin film transistor of the first conductive type; and
a second lightly doped drain region between at least either of a channel region and a source region of the pixel thin film transistor, and the channel region and a drain region of the pixel thin film transistor,
wherein the first lightly doped drain region has impurities of the first conductive type at a first impurity concentration,
wherein the channel region of the pixel thin film transistor and the channel region of the driver circuit thin film transistor of the first conductive type have impurities of the second conductive type at a second impurity concentration, which is lower than the first impurity concentration, and
wherein the second lightly doped drain region has the impurities of the first conductive type at the first impurity concentration and the impurities of the second conductive type at the second impurity concentration.

2. The semiconductor device according to claim 1, wherein the first lightly doped drain region is formed both between the channel region and the source region of the driver circuit thin film transistor of the first conductive type, and between the channel region and the drain region of the driver circuit thin film transistor of the first conductive type.

3. The semiconductor device according to claim 1, wherein the second lightly doped drain region is formed both between the channel region and the source region of the pixel thin film transistor, and between the channel region and the drain region of the pixel thin film transistor.

4. The semiconductor device according to claim 1, further comprising a third lightly doped drain region formed between the first lightly doped drain region and the channel region of the driver circuit thin film transistor of the first conductive type,
wherein the third lightly doped drain region has the impurities of the first conductive type at the first impurity concentration, and the impurities of the second conductive type at the second impurity concentration.

5. The semiconductor device according to claim 1, further comprising a fourth region formed between the first lightly doped drain region and the channel region of the driver circuit thin film transistor of the first conductive type,
wherein the fourth region has the impurities of the second conductive type at a third impurity concentration, which is lower than the second impurity concentration.

6. The semiconductor device according to claim 1, wherein the first conductive type is an n type, and the second conductive type is a p type.

7. A display device, comprising the semiconductor device according to claim 1.

8. A method for producing a semiconductor device having a pixel thin film transistor of a first conductive type, a driver circuit thin film transistor of the first conductive type, and a driver circuit thin film transistor of a second conductive type that differs from the first conductive type, comprising:
   (a) doping impurities of the first conductive type at a first impurity concentration;
   (b) doping impurities of the second conductive type at a second impurity concentration, which is lower than the first impurity concentration;
   (c) forming a first lightly doped drain region containing the impurities of the first conductive type at the first impurity concentration between at least either of a channel region and a source region of the driver circuit thin film transistor of the first conductive type, and the channel region and a drain region of the driver circuit thin film transistor of the first conductive type; and
   (d) forming a second lightly doped drain region between at least either of a channel region and a source region of the pixel thin film transistor, and the channel region and a drain region of the pixel thin film transistor, the second lightly doped drain region containing the impurities of the first conductive type at the first impurity concentration and the impurities of the second conductive type at the second impurity concentration.

9. The method for producing a semiconductor device according to claim 8, wherein the step (c) includes a step (c1) of forming the first lightly doped drain region between both the channel region and the source region of the driver circuit thin film transistor of the first conductive type, and the channel region and the drain region of the driver circuit thin film transistor of the first conductive type.

10. The method for producing a semiconductor device according to claim 8, wherein the step (d) includes a step (d1) of forming the second lightly doped drain region between both the channel region and the source region of the pixel thin film transistor, and the channel region and the drain region of the pixel thin film transistor.

11. The method for producing a semiconductor device according to claim 8, wherein the step (a) includes a step (a1) of forming a third lightly doped drain region, which has the impurities of the first conductive type at the first impurity concentration and the impurities of the second conductive type at the second impurity concentration, between the first lightly doped drain region and the channel region of the driver circuit thin film transistor of the first conductive type.

12. The method for producing a semiconductor device according to claim 8, wherein the step (a) includes a step (a2) of forming a fourth region, which has the impurities of the second conductive type at a third impurity concentration that is lower than the second impurity concentration, between the first lightly doped drain region and the channel region of the driver circuit thin film transistor of the first conductive type.

13. The method for producing a semiconductor device according to claim 8,
   wherein the step (a) includes a step (a3) of doping impurities of the n type at the first impurity concentration, and
   wherein the step (b) includes a step (b1) of doping impurities of the p type at the second impurity concentration, which is lower than the first impurity concentration.

* * * * *